(12) United States Patent
Wu et al.

(10) Patent No.: US 9,460,828 B2
(45) Date of Patent: Oct. 4, 2016

(54) GRAPHENE PRINTED PATTERN CIRCUIT STRUCTURE

(71) Applicant: Enerage Inc., Yilan County (TW)

(72) Inventors: Mark Y Wu, Yilan County (TW); Cheng-Yu Hsieh, Yilan County (TW); Jing-Ru Chen, Yilan County (TW); Shu-Ling Hsieh, Yilan County (TW); Kuan-Ting Li, Yilan County (TW)

(73) Assignee: ENERAGE INC., Wujie Township, Yilan County (TW)

( * ) Notice: Subject to any disclaimer, the term of this patent is extended or adjusted under 35 U.S.C. 154(b) by 0 days.

(21) Appl. No.: 14/528,936

(22) Filed: Oct. 30, 2014

(65) Prior Publication Data

US 2016/0012936 A1 Jan. 14, 2016

(30) Foreign Application Priority Data

Jul. 14, 2014 (TW) .............................. 103124112 A

(51) Int. Cl.
*H01B 1/24* (2006.01)
*H05K 1/09* (2006.01)
*H05K 1/03* (2006.01)

(52) U.S. Cl.
CPC .............. *H01B 1/24* (2013.01); *H05K 1/0313* (2013.01); *H05K 1/097* (2013.01)

(58) Field of Classification Search
CPC .................................................. C09D 11/52
See application file for complete search history.

(56) References Cited

U.S. PATENT DOCUMENTS

2010/0000441 A1* 1/2010 Jang ..................... C09D 11/037
106/31.13
2011/0042813 A1* 2/2011 Crain ........................ C09C 1/46
257/746

FOREIGN PATENT DOCUMENTS

| CN | 103319954 A | 9/2013 |
|---|---|---|
| CN | 103468057 A | 12/2013 |
| WO | WO 2014/070500 A1 | 5/2014 |

* cited by examiner

*Primary Examiner* — Ian Rummel
(74) *Attorney, Agent, or Firm* — Muncy, Geissler, Olds & Lowe, P.C.

(57) ABSTRACT

Disclosed is a graphene printed circuit pattern structure including a substrate excellent in electrical insulation and a graphene printed circuit layer provided on the substrate. The graphene printed circuit layer is electrically conductive and has a circuit pattern like an electrical circuit on the circuit board. The graphene printed circuit layer includes surface-modified nanographene platelets, a carrier resin and a filler. The ratio of the particle size of the filler to the thickness of the surface-modified nanographene platelet is 2-1000, and the surface-modified nanographene platelets are dispersed in the carrier resin. The filler is uniformly placed among the surface-modified nanographene platelets so as to enhance effective contact for the surface-modified nanographene platelets. The graphene printed circuit pattern structure provides excellent electrical properties and heat dissipation to achieve protection by preventing electrical elements from overheat.

4 Claims, 1 Drawing Sheet

GRAPHENE PRINTED PATTERN CIRCUIT STRUCTURE

CROSS-REFERENCES TO RELATED APPLICATION

This application claims the priority of Taiwanese patent application No. 103124112, filed on Jul. 14, 2014, which is incorporated herewith by reference.

BACKGROUND OF THE INVENTION

1. Field of the Invention

The present invention generally relates to a graphene printed circuit pattern structure, and more specifically to a graphene printed circuit pattern structure having surface-modified nanographene platelets uniformly dispersed in a carrier resin and a filler among the nanographene platelets to enhance contact property so as to greatly increase electrical conductivity and thermal conductivity.

2. The Prior Arts

As well known, gold, silver and copper are the excellent materials for electrical conductivity. In particular, copper is the best option for the conductive wiring material in consideration of the manufacturing cost, process and endurance such that circuit boards generally employ copper foil as the electrical circuit layer. However, high quality copper foil is still costly and the manufacturers of the circuit boards have been pushed to develop other materials to replace copper foil.

Since Andre Geim and Konstantin Novoselov at the University of Manchester in the UK in 2004 successfully manufactured graphene from a piece of graphite by use of adhesive tape and were thus awarded the Nobel Prize in Physics for 2010, graphene has been widely applied to various fields due to its excellent physical properties like electrical conductivity, thermal conductivity, chemical resistance, and so on. Specifically, graphene is 0.335 nm in thickness, about only one carbon diameter, and constructed by two-dimensional crystal bonded with $sp^2$ hybrid orbital in a form of hexagonal honeycomb. It is believed that graphene is the thinnest material in the world, and its mechanical strength is larger than steel by one hundred times more with its specific gravity only one fourth of steel. In particular, graphene is also a material with excellent thermal conductivity and electrically conductivity. Its theoretical thermal conductivity is even up to 5300 W/mK and graphene is thus an ideal material for heat dissipation.

However, one of the problems in the actual application of graphene is that graphene is easy to congregate or stack together to form a bulk. As a result, graphene is hard to be uniformly dispersed in the medium. Thus, preventing graphene sheets from stacking on each other so as to obtain graphene powder with high uniformity and less layers is the primary bottleneck for the present industries.

Electrically conductive circuits have been widely applied in many electronic industries such as micro electronic assembly and circuit substrate layout. The etching process for conductive films and the conductive slurry process are the two most commonly used schemes to manufacture the circuits on the PCB (printed circuit board). However, the etching process is complicated and possibly results in high cost and the troublesome issue of treating waste solution. As a result, the conductive slurry process has dominated the current PCB market to manufacture the electrical circuits.

In the prior arts, CN103468057A disclosed a graphene conductive ink formed by employing graphene with few stack layers, binding resin, dispersive, antifoaming agent and stabilizer. The above ingredients are well mixed by use of a dispersion apparatus and then finely ground in a grinding mill. Finally, the resultant slurry is filtered to obtain uniformly mixed graphene conductive ink. This technique needs to use graphene with a structure formed of one to three layers, which is easy to congregate and form a bulk. Actually, it is difficult to uniformly disperse graphene by only the dispersive, and the whole electrical conductivity is adversely affected.

Another CN103319954A disclosed a graphene conductive ink and a method of manufacturing the same. This patent primarily employs modified or non-modified graphene, binding resin and other additives, which are processed by high speed mixing and ultrasonic dispersion to prepare a conductive slurry. One of the drawbacks is that graphene sheets in the coating layer has poor contact property and fails to form an intact conductive network.

Additionally, WO2014070500A1 disclosed a conductive ink and a conductive coating. The conductive ink includes a conductive polymer solution comprising conductive polymer dissolved in an aqueous-based media and a mixture of carbon nanotubes and graphene oxide sheets dispersed in the conductive polymer solution. The conductive coating includes a conductive polymer and a mixture of graphene oxide sheets and carbon nanotubes dispersed in the conductive polymer. The graphene oxide sheets are easily dispersed in the queous-based media because of oxygen-containing functional groups. Specifically, the graphene oxide sheets are electrochemically reduced after the heating process at 150° C., and furthermore, carbon nanotubes and the conductive polymer are added to obtain conductive circuits. However, the graphene oxide sheets have poor electrical conductivity. While the heating process at 150° C. is performed, the graphene oxide sheets are still not fully reduced. As a result, the whole conductive property is only slightly improved, Therefore, it is greatly needed for the graphene printed circuit pattern structure employing surface-modified nanographene platelets with specific surface property easily and uniformly dispersed in a carrier resin, and a filler uniformly placed among the surface-modified nanographene platelets to enhance effective contact for the surface-modified nanographene platelets, thereby overcoming the above problems in the prior arts.

SUMMARY OF THE INVENTION

The primary object of the present invention is to provide a graphene printed circuit pattern structure comprising a substrate and a graphene printed circuit layer provided on at least one surface of the substrate like the upper surface. The substrate is excellent in electrical insulation and the graphene printed circuit layer is electrically conductive and forms a circuit pattern serving as the electrical circuit for the common circuit board. Specifically, the graphene printed circuit layer comprises a plurality of surface-modified nanographene platelets, a carrier resin and a filler. The surface-modified nanographene platelets are uniformly dispersed in the carrier resin and the filler provided among the surface-modified nanographene platelets is used to help the surface-modified nanographene platelets connect each other.

Preferably, the ratio of the particle size of the filler to the thickness of the surface-modified nanographene platelet is 2-1000.

The substrate is formed of an electrical isolation material such as polyethylene terephthalate (PET), polyimide, epoxy resin and phenolic resin. The graphene printed circuit layer has a thickness less than 50 μm. More specifically, the preferred concentrations of the surface-modified nanographene platelets, the carrier resin and the filler in the graphene printed circuit layer are about 0.1-30 wt %, 20-70 wt % and 10-50 wt %, respectively.

The surface-modified nanographene platelet at lest comprises a surface-modified layer provided on the surface-modified nanographene platelet, and the surface-modified layer comprises at least one functional group, which is selected from a group consisting of at least one of ethyl group, lipoepoxylalkyl group, styryl group, methylpropylacyloxy group, acrylyloxy group, lipoamino group, chloropropyl group, lipothiohydroxy group, liposulfido group, isocyanato group, lipourea group, lipocarboxyl group, lipohydroxyl group, cyclohexanyl group, phenyl group, lipoformyl group, acetyl group and benzoly group.

The carrier resin is selected from a group consisting of at least one of Polyvinylidene fluoride (PVDF), Poly tetrafluoroethylene (PTFE), polyethylene terephthalate (PET), polyurethane, Poly ethylene oxide, polyacrylonitrile, polyacrylamide, polymethyl acrylate, polymethacerylate (PMMA), polyvinyl acetate, polyvinylpyrrolidone (PVP), polytetraethylene glycol butanediol diacrylate, polyimide, cellulose acetate, cellulose acetate butyrate, cellulose acetate propionate, ethyl cellulose, cyanoethyl cellulose, polycyanoethyl vinyl alcohol, methylcarboxylic cellulose, epoxy resin, phenolic resin and silicone resin.

The filler is selected from a group consisting of at least one of metal particles, graphite, carbon nanotubes and carbon black. Further, the metal particle is selected from a group consisting of at least one of gold, silver, copper, nickel, titanium and aluminum.

The graphene printed circuit layer of the present invention has sheet resistance less than 100 ohm/sq.

In general, the graphene printed circuit pattern structure can be processed to form a patterned graphene conductive layer on the electrical isolation substrate through screen printing, knife coating or spraying. In fact, the graphene printed circuit pattern structure also possesses thermally conductive property with a planar thermal conductivity greater than 1 W/mK.

Since the surface-modified nanographene platelets of the present invention provides specific surface property to increase the dispersibility and affinity for the carrier resin, and the filler greatly helps the nanographene platelets contact each other, the graphene printed circuit layer thus possesses excellent electrical conductivity and thermal conductivity to enhance heat dissipation effect, thereby preventing overheat and achieving environmental protection.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
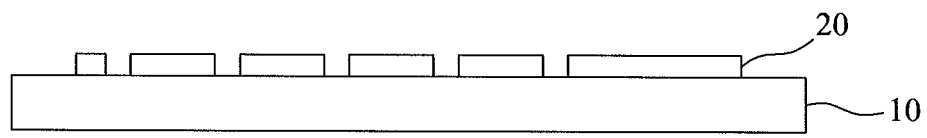
FIG. 1 is a sectional view showing the graphene printed circuit pattern structure according to the present invention.
Figure 2:
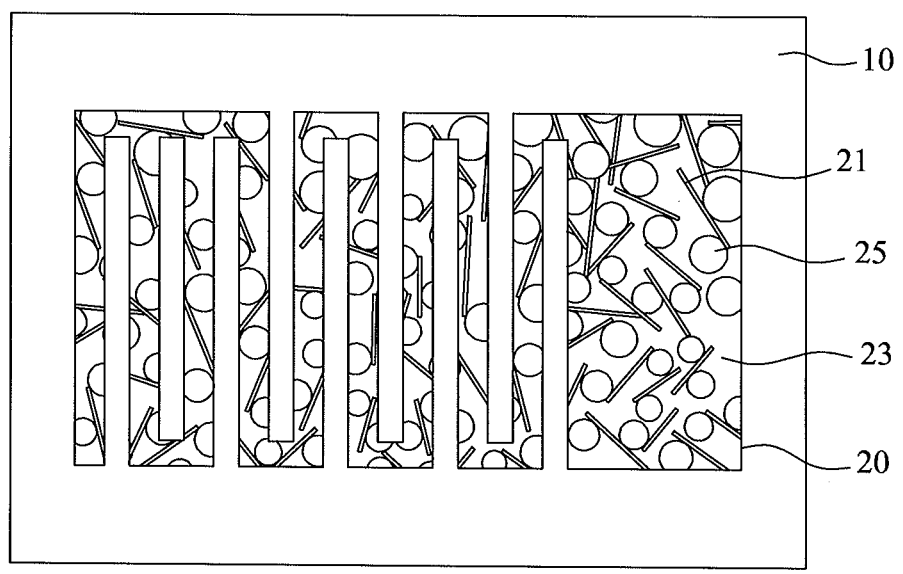
FIG. 2 is a top view of the graphene printed circuit pattern structure according to the present invention.

Please refer to FIGS. 1 and 2 showing the sectional view and top view of the graphene printed circuit pattern structure according to the present invention, respectively. It should be noted that FIGS. 1 and 2 are only intended to clearly illustrate the aspects of the present invention like the relationship among the primary components, and thus the primary components are not scaled to the actual size. Therefore, the thickness, size, shape, arrangement and location of the components are shown for reference, and not intended to limit the scope of the present invention.

As shown in FIGS. 1 and 2, the graphene printed circuit pattern structure of the present invention generally comprises a substrate 10 and a graphene printed circuit layer 20. The graphene printed circuit layer 20 is provided on at least one surface of the substrate 10 like the upper surface in FIG. 1. The substrate 10 is excellent in electrical insulation and the graphene printed circuit layer 20 is electrically conductive and forms a circuit pattern serving as the electrical circuit for the common circuit board.

Specifically, the graphene printed circuit layer 20 comprises a plurality of surface-modified nanographene platelets 21, a carrier resin 23 and a filler 25. The surface-modified nanographene platelets 21 are uniformly dispersed in the carrier resin 23, and the filler 25 is provided among the surface-modified nanographene platelets so as to help the surface-modified nanographene platelets 21 connect each other, thereby forming a structure of electrically conductive network and greatly improving the entire conductive property.

It should be noted that the surface-modified nanographene platelet 21 is shown as the side surface of a thin sheet for simplification in order to conveniently and clearly illustrate the technical characteristics and the effects of the present invention. That is, the actual shape of the surface-modified nanographene platelet 21 seen from the side view or the top view is possibly the front surface, the side surface, or a combination of the front surface and the side surface.

Preferably, the substrate 10 is formed of an electrical isolation material, which is selected from a group consisting of lat least one of polyethylene terephthalate (PET), polyimide, epoxy resin and phenolic resin.

The graphene printed circuit layer 20 has a preferred thickness less than 50 μm. Additionally, the surface-modified nanographene platelets 21, the carrier resin 23 and the filler 25 are about 0.1-30 wt % (weight percent of the graphene printed circuit layer 20), 20-70 wt % and 10-50 wt %, respectively.

More specifically, each surface-modified nanographene platelet 21 comprises at least one surface-modified layer provided on the surface of the surface-modified nanographene platelet 21, and the surface-modified layer is formed of at least one surface modifying agent. Furthermore, the surface modifying agent is selected from a coupling agent, which has a chemical formula $M_x(R)_y(R')_z$, M is metal element, where R is a hydrophilic group, R' is a hydrophobic group, and $0 \leq x \leq 6$, $1 \leq y \leq 20$, $1 \leq z \leq 20$. The surface-modified nanographene platelet 21 has an oxygen content of 2-20 wt % and is chemically bound with the carrier resin 23 and the filler 25 through the hydrophilic group and the hydrophobic group. Therefore, the functional groups of the surface-modified layer may greatly improve cohesion force to the carrier resin 23 such that the surface-modified nanographene platelets 21 are easily dispersed in the carrier resin 23.

The surface modifying agent is defined by a chemical formula Rx-Ry, where R is selected from a group consisting of at least one benzene ring, pyridine and triazine, R' is selected from a group consisting of at least one of amino group, alkoxy, carbonyl, carboxyl, acyloxy, acylamino, alkyleneoxy, dimethylamino and alkyleneoxy-carboxyl, $1 \leq x \leq 4$, and $0 \leq y \leq 10$.

Additionally, the carrier resin 23 is selected from a group consisting of at least one of Polyvinylidene fluoride (PVDF), Poly tetrafluoroethylene (PTFE), polyethylene terephthalate (PET), polyurethane, Poly ethylene oxide, polyacrylonitrile, polyacrylamide, polymethyl acrylate, polymethacerylate (PMMA), polyvinyl acetate, polyvinylpyrrolidone (PVP), polytetraethylene glycol butanediol diacrylate, polyimide, cellulose acetate, cellulose acetate butyrate, cellulose acetate propionate, ethyl cellulose, cyanoethyl cellulose, polycyanoethyl vinyl alcohol, methylcarboxylic cellulose, epoxy resin, phenolic resin and silicone resin.

In particular, the filler 25 is electrically conductive and as a form of solid state particles powder, sheets or filaments. The primary effect of the filler 25 is to help the surface-modified nanographene platelets 21 contact each other, thereby increasing electrical conductivity. Since the surface-modified nanographene platelets 21 are substantially thin flakes, the contact area is large and electrical conductivity is excellent if all the surface-modified nanographene platelets 21 are fully in contact by the planar surfaces. However, the surface-modified nanographene platelets 21 are uniformly dispersed in the carrier resin 23 and each one may have different posture. As a result, some adjacent surface-modified nanographene platelets 21 may contact by their edges of corners such that the contact area is greatly reduced and electrical conductivity decreases because electrical conductivity is roughly proportional to the whole contact area of the conductive network. Therefore, the filler 25 in the graphene printed circuit layer 20 can physically contact all or some of the surface-modified nanographene platelets 21 to provide additional effective contact area, thereby improving electrical conductivity.

Based on the above effect, a ratio of the particle size of the filler 25 to the thickness of the surface-modified nanographene platelet 21 is about 2-1000, and the graphene printed circuit layer 20 has sheet resistance less than about 100 ohm/sq.

The filler 25 is selected from a group consisting of at least one of metal particles, graphite, carbon nanotubes and carbon black, and the metal particle is selected from a group consisting of at least one of gold, silver, copper, nickel, titanium and aluminum.

To further illustrate the specific effect of the present invention to make those skilled in this technical field well understand the entire process, some illustrative examples are explained in the following.

EXPERIMENTAL EXAMPLE 1

The recipe includes phenolic resin (53 wt %) as the carrier resin, carbon black (31 wt %) as the filler and the surface-modified nanographene platelet (16 wt %). Additionally, polyethylene terephthalate (PET) is used as the substrate.

First, the above ingredients are pre-blended, and then well mixed at 8000 rpm for 48 hours in an emulsifier to obtain a slurry. Next, the slurry is coated on the substrate to form the graphene printed circuit layer by the knife-coating process. After a drying process at 150° C. in the oven, all the liquid components are removed by evaporation so as to solidify the graphene printed circuit layer and form the graphene printed circuit pattern structure.

EXPERIMENTAL EXAMPLE 2

This recipe includes 57 wt % of phenolic resin as the carrier resin, 31 wt % of carbon black as the filler and 16 wt % of the surface-modified nanographene platelet, and the substrate ispolyethylene terephthalate.

All the ingredients are pre-blended, and then well mixed at 8000 rpm for 48 hours in an emulsifier to obtain a slurry. The knife-coating process is then performed to coat the slurry on the substrate to form the graphene printed circuit layer. After the drying process in the oven at 90° C. for one hour, the graphene printed circuit pattern structure is obtained by removing all the liquid components.

EXPERIMENTAL EXAMPLE 3

This time, the recipe includes 57 wt % of phenolic resin as the carrier resin, 18 wt % of carbon black as the filler and 25 wt % of the surface-modified nanographene platelet, and the substrate ispolyethylene terephthalate.

The ingredients are pre-blended, and then well mixed and ground for 12 hours in a grinding mill to obtain a conductive slurry. Then, the slurry is coated on the substrate by knife-coating to form the graphene printed circuit layer. After the drying process in the oven or the heating plate at 70° C. for one hour, all the liquid components are removed and the graphene printed circuit pattern structure is obtained.

TABLE 1

| sample | Example 1 | Example 2 | Example 3 |
| --- | --- | --- | --- |
| Sheet resistance (ohm/sq) | 12 | 15 | 10.5 |

Table 1 illustrates a list of measured sheet resistance of the graphene printed circuit pattern structure obtained in the above examples 1-3. As shown in Table 1, it is obvious that the graphene printed circuit pattern structure of the present invent has considerably low sheet resistance. Since the manufacturing process is simple and implemented by current tools or traditional apparatus, the present invention actually provides industrial applicability.

From the above mention, one primary feature of the present invention is that the surface-modified nanographene platelets greatly increase dispersibility and affinity to the carrier resin, and the filler helps the surface-modified nanographene platelets contact each other so as to form the electrically conductive network structure. Thus, the whole electrical conductivity is improved and applicable to replace traditional copper foil. In particular, the surface-modified nanographene platelets are excellent in thermal conductivity and enhance heat dissipation effect to remove the heat generated by electrical components, thereby preventing overheat and achieving protection. Therefore, the graphene printed circuit pattern structure of the present invention possesses both excellent electrical conductivity and thermal conductivity.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A graphene printed circuit pattern structure, comprising:
 a substrate having electrical insulation; and
 a graphene printed circuit layer being electrically conductive, provided on at least one surface of the substrate and forming a circuit pattern, the graphene printed circuit layer comprising a plurality of surface-modified nanographene platelets, a carrier resin and a filler, the surface-modified nanographene platelets uniformly dispersed in the carrier resin, the filler provided among the surface-modified nanographene platelets to help the surface-modified nanographene platelets connect each other, wherein the carrier resin is phenolic resin; the filler is selected from at least one of graphite, carbon nanotubes and carbon black; the surface-modified nanographene platelet comprises a surface-modified layer having hydrophilic groups and hydrophobic groups, and the surface-modified nanographene platelets are chemically bound with the filler and the carrier resin through the hydrophilic groups and the hydrophobic groups, wherein a ratio of the particle size of the filler to the thickness of the surface-modified nanographene platelet is 2-1000, and the surface-modified nanographene platelets, the carrier resin and the filler in the graphene printed circuit layer are about 0.1-30 wt % (weight percent of the graphene printed circuit layer), 20-70 wt % and 10-50 wt %, respectively.

2. The graphene printed circuit pattern structure as claimed in claim 1, wherein the surface-modified layer is formed of a coupling agent, the coupling agent has a chemical formula $M_x(R)_y(R')_z$, M is metal element, R is a hydrophilic group, R' is a hydrophobic group, $0 \leq x \leq 6$, $1 \leq y \leq 20$, $1 \leq z \leq 20$, the surface-modified nanographene platelet has an oxygen content of 2-20 wt %.

3. The graphene printed circuit pattern structure as claimed in claim 1, wherein the graphene printed circuit layer has sheet resistance less than 100 ohm/sq.

4. The graphene printed circuit pattern structure as claimed in claim 1, wherein the substrate is formed of an electrical isolation material, and the electrical isolation material is selected from a group consisting of at least one of polyethylene terephthalate (PET), polyimide, epoxy resin and phenolic resin.

* * * * *